United States Patent [19]
Sevillano et al.

[11] Patent Number: 5,518,759
[45] Date of Patent: May 21, 1996

[54] HIGH GROWTH RATE PLASMA DIAMOND DEPOSITION PROCESS AND METHOD OF CONTROLLING SAME

[75] Inventors: Evelio Sevillano, Lexington; Lawrence P. Bourget, Winchester; Richard S. Post, Lexington, all of Mass.

[73] Assignee: Applied Science and Technology, Inc., Woburn, Mass.

[21] Appl. No.: 377,124

[22] Filed: Jan. 23, 1995

Related U.S. Application Data

[63] Continuation-in-part of Ser. No. 98,958, Jul. 28, 1993, Pat. No. 5,405,645.

[51] Int. Cl.$^6$ ............................ B05D 3/06; C23C 16/50
[52] U.S. Cl. ........................ 427/10; 427/575; 427/577; 427/122; 427/249; 423/446
[58] Field of Search ........................ 427/577, 575, 427/10, 122, 249; 423/446; 117/920

[56] References Cited

U.S. PATENT DOCUMENTS

| | | | |
|---|---|---|---|
| 4,957,591 | 9/1990 | Sato et al. | 156/643 |
| 5,110,577 | 5/1992 | Tamor et al. | 423/445 |
| 5,314,540 | 5/1994 | Nakamura et al. | 118/723 DC |

*Primary Examiner*—Roy V. King
*Attorney, Agent, or Firm*—Testa, Hurwitz & Thibeault

[57] ABSTRACT

A process for depositing diamond on a substrate using a microwave plasma generator including introducing a feed which includes diamond forming constituents in a desired ratio to the microwave plasma generator, and providing sufficient microwave power to the microwave plasma generator to produce a greenish-colored plasma which emits a spectrum monitored to maintain a relative emission intensity ratio of two of the constituents in a predetermined range, for depositing high quality diamond at an extremely high rate on the substrate placed proximate or in the plasma.

16 Claims, 5 Drawing Sheets

HIGH GROWTH RATE PLASMA DIAMOND DEPOSITION PROCESS AND METHOD OF CONTROLLING SAME

GOVERNMENT RIGHTS

This material is based upon work supported by the National Science Foundation under Grant Number ISI-9060510. The government has certain rights in this material.

RELATED CASE

This application is a continuation-in-part of a U.S. patent application, Ser. No. 8/098,958, filed Jul. 28, 1993, now U.S. Pat. No. 5,405,645, entitled, "High Growth Rate Plasma Diamond Deposition Process and Method of Controlling Same" by Sevillano et al.

FIELD OF INVENTION

This invention relates to a high growth rate microwave plasma diamond deposition process that deposits high quality diamond films at growth rates an order of magnitude or more greater than presently available microwave plasma diamond deposition processes.

BACKGROUND OF INVENTION

There has been much effort made of late in the field of commercial production diamond. There are many high pressure processes such as plasma torches that deposit diamond on only a very small surface area. If the flame is spread out over a large surface area, the diamond quality suffers dramatically. Of the different techniques, microwave plasma enhanced chemical vapor deposition has produced the highest quality diamond films over acceptable surface areas.

Most such microwave plasma enhanced CVD processes operate at total microwave power of approximately 1,500 watts and at pressures of up to 50 Torr. The feed gas is typically a dilute hydrocarbon, for example 1% to 5% methane. Sometimes, small amounts of oxygen are added to the feed gas. Such systems deposit diamond at growth rates of about 2 microns per hour. However, such low deposition rates have kept the process from becoming commercially feasible.

SUMMARY OF THE INVENTION

It is therefore an object of this invention to provide a microwave enhanced diamond deposition process that deposits diamond at an extremely high rate.

It is a further object of this invention to provide such a process which deposits high quality diamond films at a high deposition rate.

It is a further object or this invention to provide such a process which can deposit diamond at high growth rates over relatively large surface areas.

This invention results from the realization that an extremely high growth rate microwave plasma enhanced chemical vapor deposition process may be accomplished by increasing the microwave power density in the plasma to achieve thermal plasma conditions characterized by a great increase in the relative concentration of $C_2$ radicals in the plasma. The presence of $C_2$ radicals is a result of chemical reactions among two C species.

This invention may be accomplished in a process for depositing diamond on a substrate using a deposition reactor such as a pressured microwave plasma generator contemplating introducing a feed, which includes diamond forming constituents, in a desired ratio to the deposition reactor, and providing sufficient microwave power to the reactor to produce a greenish-colored plasma which emits a spectrum monitored to maintain a relative emission intensity ratio of two of the constituents in a predetermined range indicative of depositing high quality diamond at a high rate on a substrate placed proximate or in the plasma. In one embodiment, the feed is comprised of gases, for example methane and oxygen at a desired ratio. In another embodiment, the feed is provided through evaporation of liquids and/or sputtering of solids. Acetone or other substances having diamond forming constituents may be used in some instances and water may also be used in other instances. In addition, the feed may be contaminated by other non-diamond forming atomic or molecular species such as nitrogen or a cyano group.

Preferably, the spectrum of the plasma is monitored with a device such as a spectrometer. In this case, the process may contemplate resolving the relative intensity of a first constituents emissions as well as the relative intensity of a second constituents emissions. These emissions may emanate not only from an atomic species of a particular constituent such as $H_\alpha$ and $H_\beta$ but also from a molecular species of a constituent such as CH or $C_2$. Additionally, such constituents may include non-diamond forming contaminants, such as nitrogen, which may also emit a band indicative of an atomic or a molecular species, such as the cyano group CN. Preferably, the relative emission intensity ratio of the spectrum is monitored and at least one of the diamond forming constituents, the microwave power or the pressure is then adjusted to achieve a desired ratio. That ratio is predetermined to affect the maximum rate of diamond deposition on the substrate while maintaining a high quality diamond product. The intensity of the spectrum is preferably monitored through the center of the plasma rather than at its edges, and the adjustment of the above stated parameters may include aborting a particular run depending on the relative emission ratio of contaminants to the background signal surrounding such contaminants emission peak.

The process contemplates employing a desired microwave power level. Preferably, the power is held at from 0.2 kilowatts (kW) per square centimeter to 5 kW per square centimeter substrate deposition area. In one embodiment, the total power is up to 3 megawatts (MW). The process preferably also contemplates controlling the pressure in the microwave plasma generator. The plasma generator is preferably operated in the diffusion regime. The pressure may be held between 10 Torr and 1 atmosphere, and is preferably between 50 and 200 Torr.

DISCLOSURE OF PREFERRED EMBODIMENT

Other objects, features and advantages will occur to those skilled in the art from the following description of a preferred embodiment and the accompanying drawings in which:

FIG. 1 is a schematic diagram of a microwave plasma deposition system for practicing the process of this invention;

FIG. 2 is a graph of the spectrum emitted by a plasma produced according to the process of this invention illustrating the great increase in $C_2$, radicals present in the plasma, as evidenced by the emission from the Swan bands near 4383, 4737, 5165, 5636, and 6191 Å as compared to the other delineated species $H_\alpha$, $H_\beta$, CH and CN: which emit at 6562, 4860, 4308 and 3875 Å respectively;

This invention may be accomplished with a process for depositing diamond on a substrate using a deposition reactor such as a microwave plasma generator. The process contemplates introducing a feed which includes diamond forming constituents in a desired ratio to the reactor. The feed of this invention is, for example, carbon, hydrogen, oxygen (or another graphite etchant such as a halogen) or a compound consisting of at least two of these elements. The feed may also include contaminants such as nitrogen or a cyano group.

This process further includes providing sufficient microwave power to the reactor to produce a greenish-colored plasma which emits a spectrum monitored to maintain a first constituents emission intensity in a predetermined ratio to a second constituents emission intensity. The relative emission intensity ratio is calculated by comparing the emission intensity from the (0,0) crossing of one of the constituents such as $C_2$, to the emission intensity of a second constituent such as $H_\alpha$, $H_\beta$ or CH. The spectral measurements are taken with a spectrometer from Acton Research Corporation, Model SpectraPro 275, with entrance and exit slits adjusted to 10 µm; a fiber optic light guide, Model LG-455 for the wavelength range of 1900 Å to 1.1 µm, also from Acton Research Corporation; and a photomultiplier tube, Model R928, from Hamamatsu Corporation. The grating on the spectrometer is blazed at 5000 Å with 1200 grooves per millimeter. The intensity of the lines are corrected to take into account the decreased transmission of the spectrometer and the relative gains of the photomultiplier at the wavelength of the lines measured.

Figure 1:
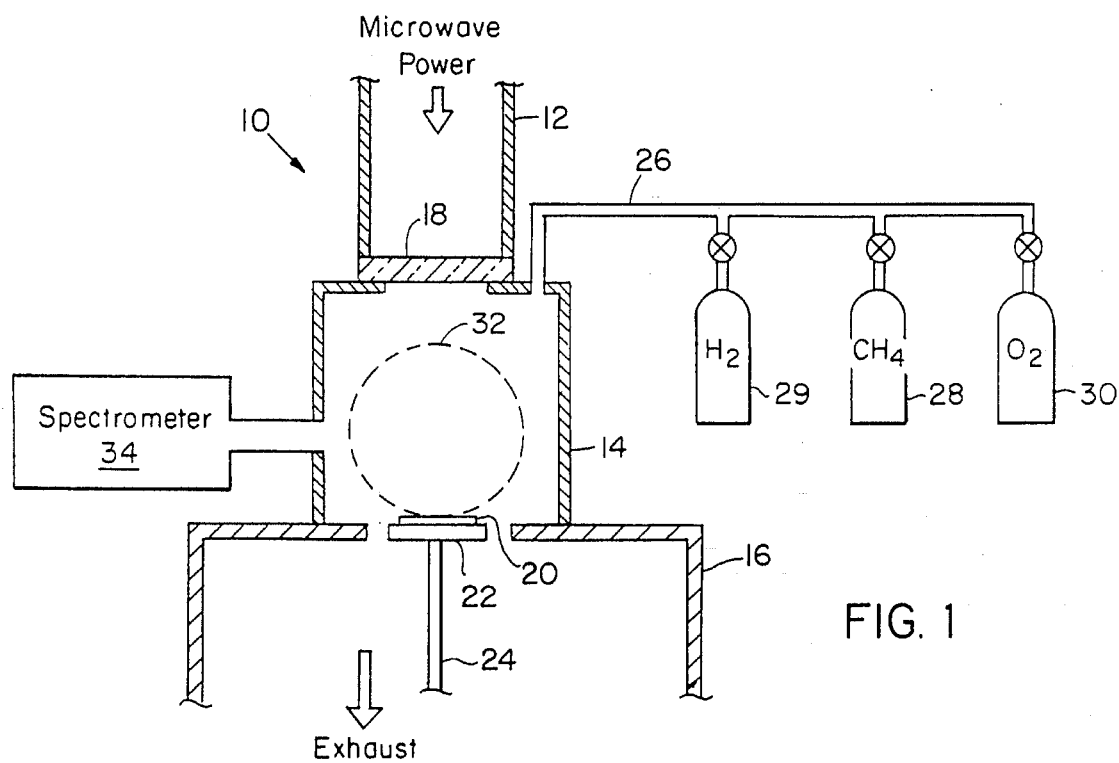

There is shown in FIG. 1 microwave plasma generator 10 which may be used to practice the process of this invention. Device 10 includes circular cross-section waveguide 12 for carrying microwave energy to circular cross-section plasma chamber 14 coupled to waveguide 12 through dielectric window 18. Substrate chamber 16 also serves as an exhaust chamber by the application of an exhaust pump, not shown. The microwave plasma generator shown here is known in the art: one example of a commercially available device which has been used to successfully practice this invention is the model AX5400 microwave plasma generator which includes a model A-5000 5 kW microwave power source both available from Applied Science and Technology, Woburn, Mass.

Substrate 20, which is typically a silicon substrate as known in the art, is held on stage 22 which may be moved in and out of plasma chamber 14 as desired through rod 24. Sources of feed gas 28, 29 and 30, for example methane hydrogen and oxygen respectively, provide a source of diamond forming constituents (e.g. the $C_2$ radical and CH from the methane gas) to chamber 14 through line 26. Chamber 14 is kept at 10 Torr to 1 atmosphere, preferably 50 to 200 Torr, with a vacuum pump, not shown. The microwave power coupled to chamber 14 then forms generally spherical plasma 32 within the chamber for depositing diamond on substrate 20. The plasma shape is based on visual observation.

Spectrometer 34 is preferably used to monitor the bulk or center area of plasma ball 32 as opposed to the periphery or edges of the plasma. Substrate 20 is placed near or within plasma 32 to deposit diamond on its surface. Spectrometer 34 is preferably used to monitor the relative emission intensity ratio of the two desired constituents as described previously. In the typical prior art microwave plasma generator systems operating at perhaps 1,500 watts, 40 Torr and 1% methane (the balance $H_2$), there is no significant (above background) emission of molecular carbon ($C_2$), while there is a significant emission in the Balmer series, such as from $H_\alpha$. This type of plasma has an orange-bluish color from the hydrogen Balmer series emissions, including the $H_\alpha$ emission at 6563 Å and the $H_\beta$ emission at 4861 Å.

Figure 2:
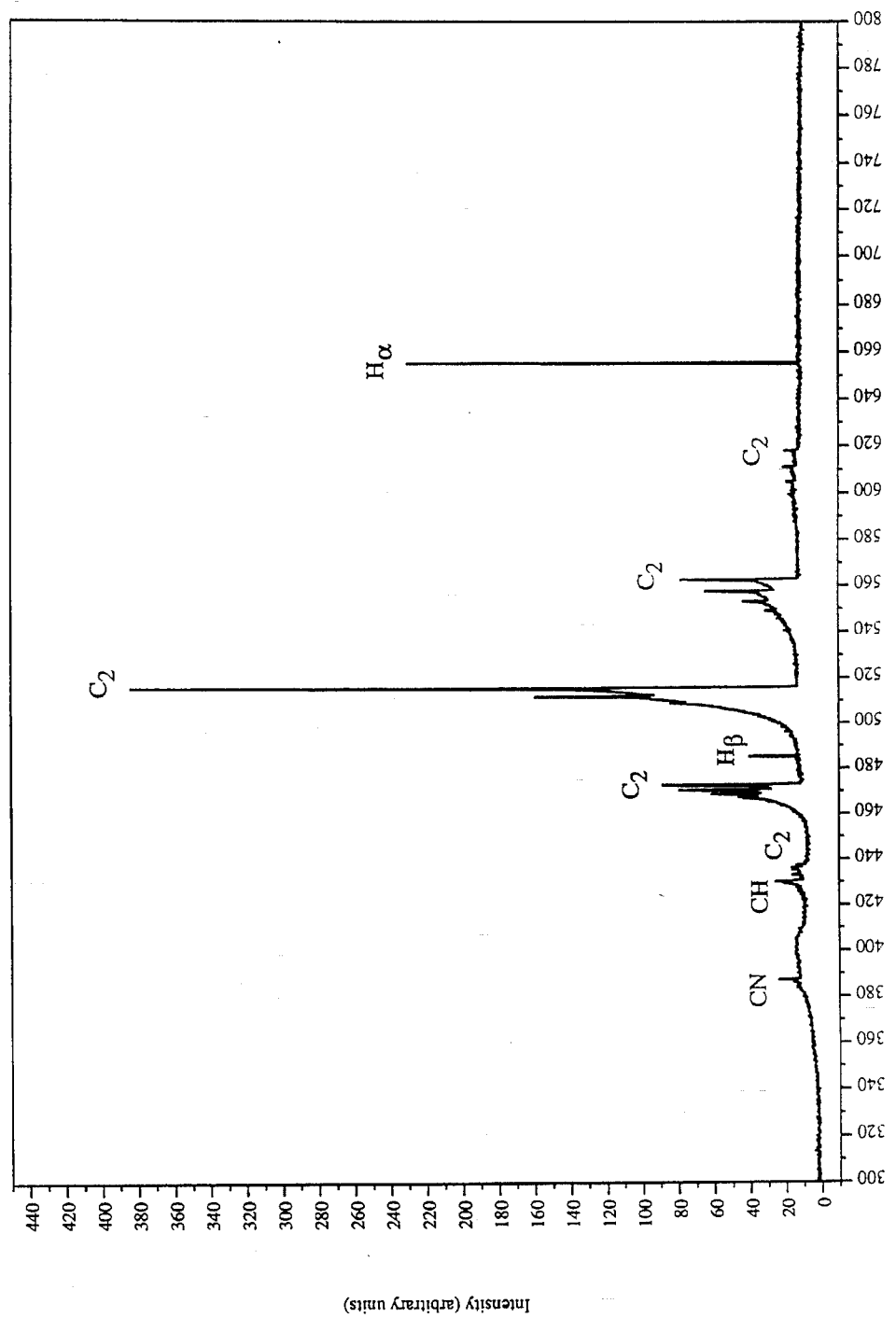

In contrast a typical spectral emission of the process of this invention is shown in FIG. 2. This data was generated for a discharge at 5,000 watts with an $H_2$ flow of 200 sccm, $CH_4$ flow of 30 sccm, and $O_2$ flow of 3 sccm, at 100 Torr. The strong lines in the green near 5165 Å were molecular carbon lines ($C_2$). Other $C_2$ lines were observed at 4737, 5636, 6191 and 4383 Å. The other lines used for comparison CH, $H_\alpha$ and $H_\beta$ were observed at 4308, 6563 and 4861 Å respectively. As can be seen, the relative intensity of $C_2$ was greater than that of any of the other species. It has been found, accordingly that sufficient $C_2$ present in the plasma is indicative of the increased deposition rate of this invention. For example, sufficient $C_2$ exists when the $C_2/H_\alpha$ ratio is from 0.1 to 1000, and more preferably from 1.0 to 40.0, with a ratio of around 1 having been found to be indicative of a plasma at a temperature for deposition of diamond at a high deposition rate (>1 micron/hour). Under these conditions, sufficient atomic hydrogen is present to result in a high-quality, low graphitic-content diamond film product. The presence of $C_2$ radicals is a consequence of the high power density in the discharge which is key to the high diamond deposition rate. At the high power densities that are established, the reactions which involve more than one carbon species are driven to completion and, as a consequence, a large increase in $C_2$ emission is obtained.

It has further been discovered that the other molecular or atomic species discussed above can also be used in the relative emission ratio as a bench mark for purposes of maintaining the predetermined maximizing range for high quality diamond deposition Therefore, other relative emission ratios which can be used are, for example $C_2/H_\beta$, $C_2$/CH, CH/$H_\alpha$ or CH/$H_\beta$.

It has also been found that by monitoring the emission ratio of the CN species relative to the background signal surrounding the CN line that deleterious conditions not indicative of high rate and quality diamond formation can be avoided. This is accomplished by monitoring the CN emission relative to the surrounding background such that when this ratio is greater than 1.05 a deleterious condition is occurring and therefore allows an operator or an autonomous system to stop a particular run before low quality diamond is deposited on a substrate.

One of the plasma conditions indicative of the high diamond growth rate regime (>1 micron/hour peak growth rate) has been found to occur at a $C_2/H_\alpha$ ratio of from 0.1 to 1000. It is theorized that the increase of $C_2$ radicals above the background emission levels found in known plasma conditions is a result of the high power density in the plasma which allows reactions which involve more than one carbon-containing species to occur. Under these high power density conditions, there is also an increase in the atomic hydrogen concentration which exists in the plasma. When the process conditions are changed from those previously known at which there is no measurable $C_2$ emission to those of the present invention, it has been found that the $C_2$ concentration may increase by up to 5 orders of magnitude, while the growth rate increases approximately 1 order of magnitude. It has also been noted that the concentration of $CH_3$ radicals and atomic hydrogen in the same plasma increases approximately an order of magnitude, leading to the conclusion that the $CH_3$ radicals may be responsible for the diamond deposition while there are sufficient H atoms to maintain the high quality of the diamond. However, the increased $C_2$ levels are clearly indicative of plasma conditions that lead to this dramatically increased deposition rate.

In operating the system of FIG. 1, the variables which may be adjusted to achieve the desired plasma conditions are the plasma power density, the substrate temperature, the gas mixture, the mass flow rate, and the operating pressure. The power density herein is defined as follows. The diamond deposition typically occurs at the fastest rate at the center of the substrate where the plasma ball is closest to the substrate. The cross sectional profile of the deposited diamond is generally Gaussian. If the 1/e thickness location of the thickness profile is taken as R, the substrate deposition area is then $\pi R^2$ for an axisymmetric spherical plasma. The power densities described herein have been calculated by dividing the total microwave power coupled to the plasma by $\pi R^2$. To obtain the high $C_2$ concentrations and therefore the high diamond growth rates of this invention, power densities in the range of 0.2 to 5 kW per square centimeter are required. If the diamond mass deposition rate is tracked along with total power, the relationship between the two is nonlinear. For example, the total diamond mass deposition rate went from 3 mg/hour at 1500 W to 60 mg/hour at 5000 W.

Figure 4:
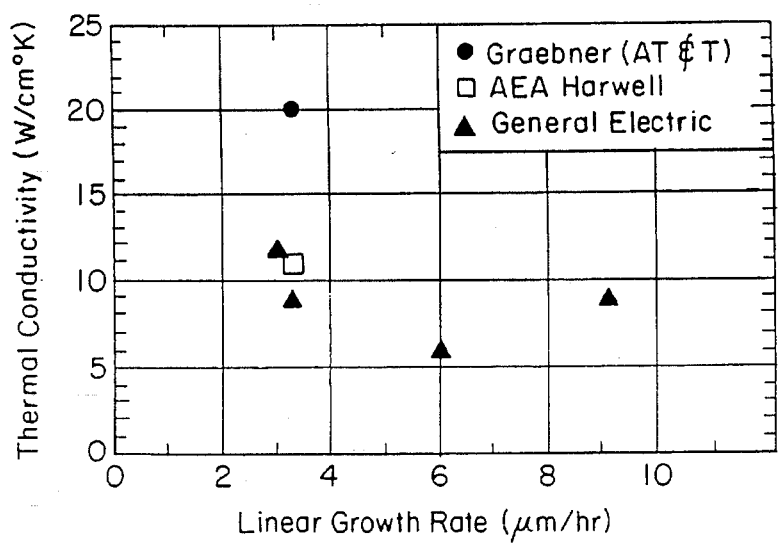
FIG. 4 is a graph of thermal conductivity measurements for diamond material grown using the process of this invention at different deposition rates.
Figure 3:
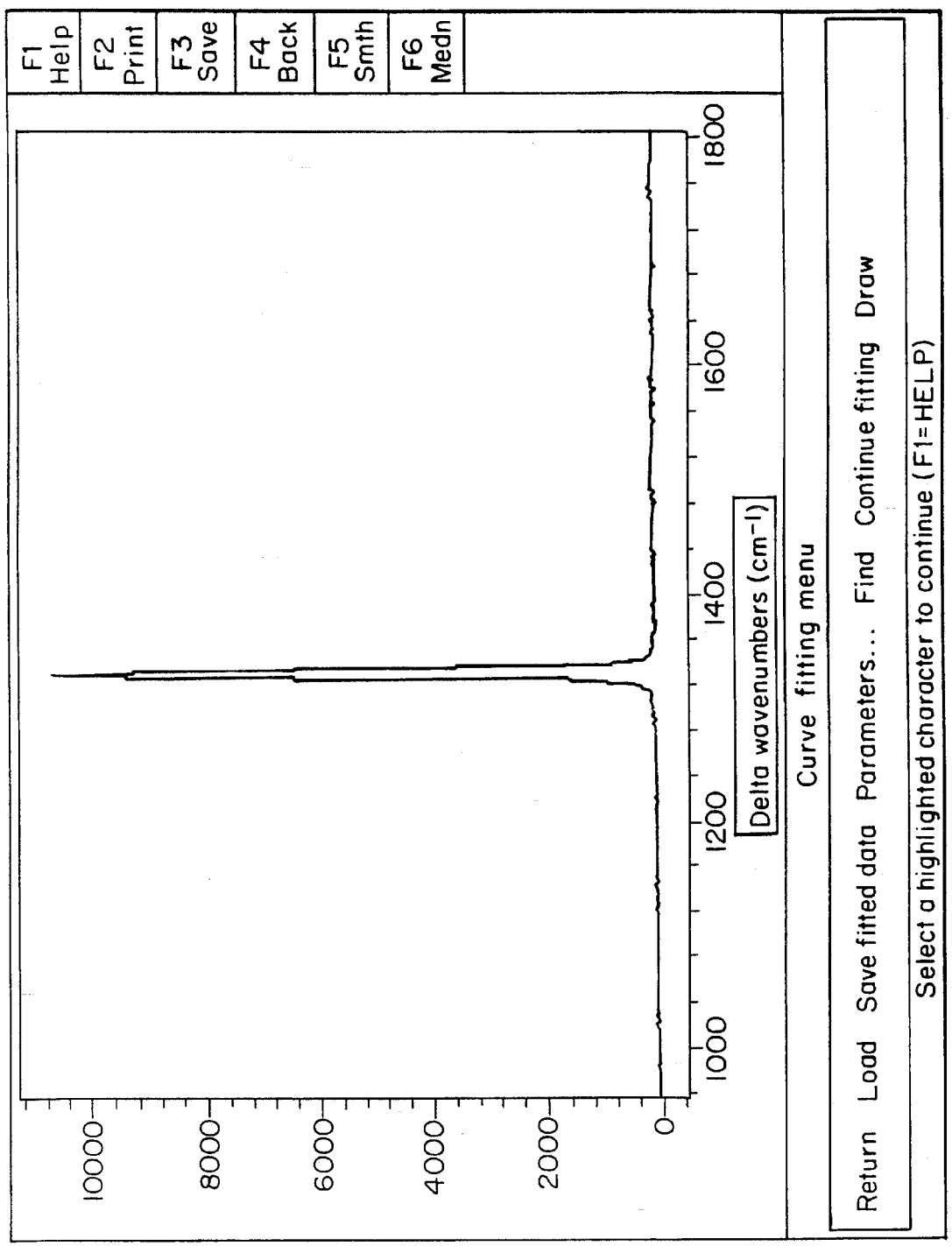
FIG. 3 is a graph of the Raman scattering from a high quality diamond film obtained by the process of this invention.

The quality of the diamond deposited by the process of this invention is typically characterized by intense Raman scattering at 1332 cm$^{-1}$, with a thermal conductivity ($\kappa$) of greater than about 2.5 W/cm° C. and a growth rate at the peak of the thickness profile of greater than 1 micron/hour. The color can be from black to clear. In FIG. 3 the Raman scattering from a high quality diamond film obtained using, this process is shown. FIG. 4 shows thermal conductivity measurements for different diamond material grown using this process at different deposition rates. It is important from an economics standpoint to note that high thermal conductivity material is obtained even at the highest deposition rates shown in FIG. 4.

The range of relative intensity ratios for the diamond forming constituents which yield high grade diamond deposition has been documented by Bachmann et al. *Diamond and Related Materials* 1 (1991), pages 1 though 12, (Elsevier Science Publishers, 1991). The species may be provided with hydrocarbons and a graphitic etchant such as oxygen or one or more of the halogens. The species may also be provided in other forms such as by supplying acetone or other substances containing diamond forming constituents which may be supplied as solids, liquids, or gases. For example, solids may be sputtered into the plasma volume and the liquids may be evaporated into the volume to provide the species at the location where the power is coupled to form the plasma. Additionally, the plasma may be formed by any of the known techniques such as microwave or RF excitation.

The following are two examples of diamond deposition processes according to this invention.

EXAMPLE 1

Figure 5:
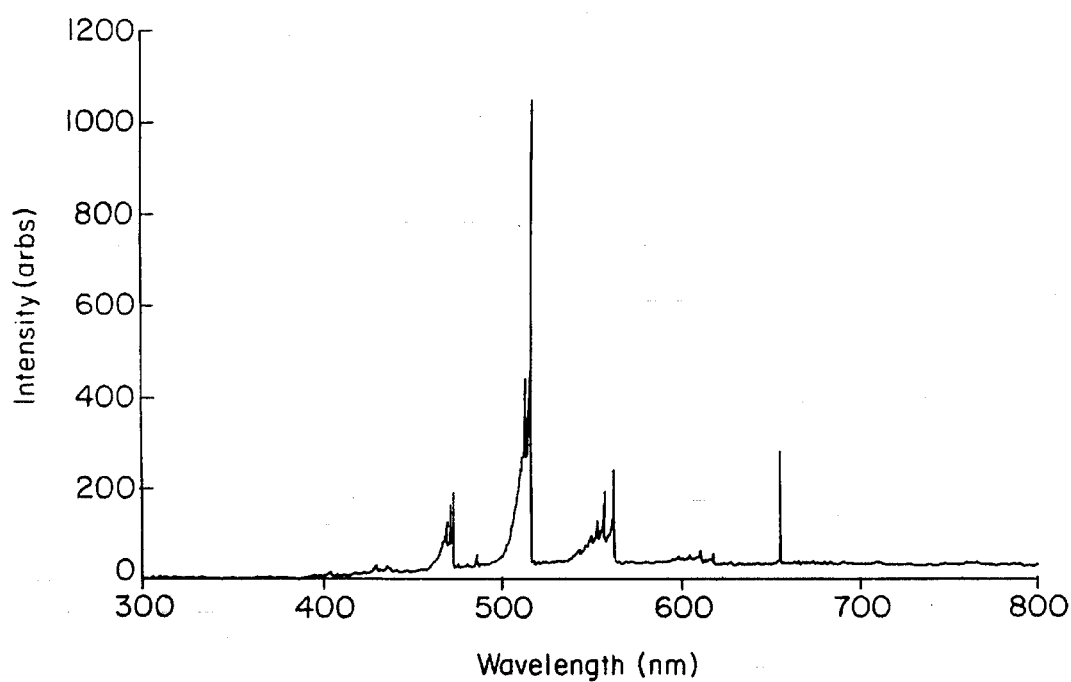
FIG. 5 is a graph of the emission spectrum for the process set forth in Example 1.

A gas mixture consisting of 717 sccm of hydrogen, 30 sccm of methane, and 3 sccm of oxygen (C/H/O ratio of 1.9/97.7/0.4) was used to grow high quality diamond at 5000 W, 110 Torr. The substrate temperature was 950° C. The observed mass deposition rate was 28 mg/hour. The emission spectrum from the plasma is shown in FIG. 5.

EXAMPLE 2

Figure 6:
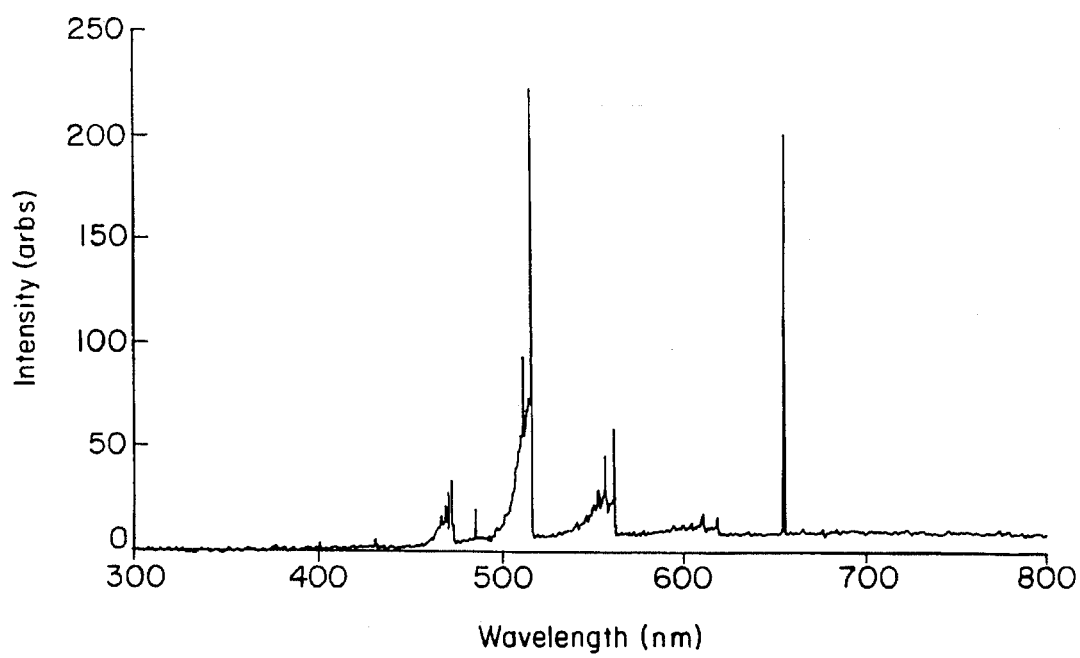
FIG. 6 is a graph of the emission spectrum for the process set forth in Example 2.

A gas mixture consisting of 200 sccm of hydrogen, 36 sccm of methane, and 5 sccm of oxygen (C/H/O ratio of 6.1/92.2/1.7) was used to grow high quality diamond at 5000 W, 120 Torr. The substrate temperature was 1020° C. The observed mass deposition rate was 95 mg/hour. The emission spectrum from the plasma is shown in FIG. 6.

Figure 7:
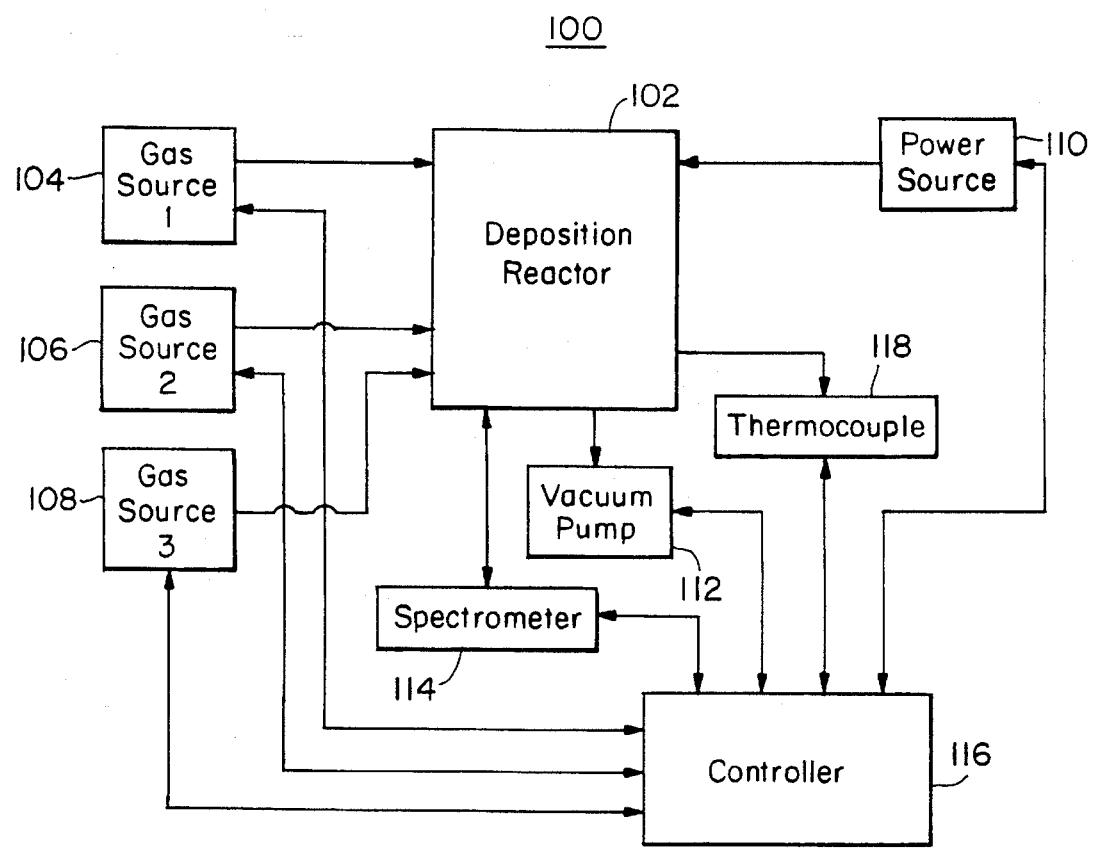
FIG. 7 is a schematic diagram of a process control system for use in this invention.

A schematic diagram of a system for controlling process conditions to maintain the desired plasma conditions is shown in FIG. 7. System 100 includes deposition reactor 102 that is fed diamond forming constituents, for example from sources of carbon, hydrogen and a graphitic etchant such as oxygen or halogens or compounds of oxygen or halogens from gas sources 104, 106 and 108. Power supply or power source 110 and vacuum pump 112 maintain, in conjunction with control of gas pressure and flow rates, a desired operating pressure and mass flow rate through reactor 102. Spectrometer 114 is used to monitor the emitted spectrum of the plasma. Thermocouple or pyrometer 118 is used to measure substrate temperature. Controller 116 is programmed to monitor the gas flow rates and pressures, the power coupled to the deposition reactor, the operation of the vacuum pump, the temperature of the substrate, and the spectrum emitted by the plasma as determined by spectrometer 114, as defined above for providing an output such as shown in FIG. 2. Controller 116 may be enabled to measure the relative intensity of a first and second constituent and determine the ratio between the two. Controller 116 may then be programmed to modify the gas flow rates, pressures, the amount of power, and/or the operating pressure to maintain a ratio at a desired level usually between 0.1 and 1000 to grow diamond at desired deposition rate and having a desired quality. The programming of controller 116 would be based on experimental data taken within the ranges described for creating a diamond having the desired characteristics such as Raman scattering line width, thermal conductivity and optical quality for the desired end use of the diamond product.

Although specific features of the invention are shown in some drawings and not others, this is for convenience only as some feature may be combined with any or all of the other features in accordance with the invention.

Other embodiments will occur to those skilled in the art and are within the following claims:

What is claimed is:

1. A process for depositing diamond on a substrate using a pressurized microwave plasma generator, comprising:

introducing a continuous feed, including diamond forming constituents, into the microwave plasma generator;

applying microwave power to the microwave plasma generator to produce a plasma which emits a spectrum;

monitoring the intensity of said spectrum continuously for at least one spectral emission, including, at least one of $C_2$ radical, alfa hydrogen $H_\alpha$, beta hydrogen $H_\beta$, or CH spectral emissions; and adjusting at least one of the amount of said diamond forming constituents, the microwave power, and the pressure within the generator in response to the monitored intensity of said spectrum to maintain a plasma in which the relative emission intensity ratio of two of said constituents is in a preselected range, to maximize the rate of diamond deposition on the substrate placed proximate to or within the plasma.

2. The process of claim 1 in which said feed includes hydrogen, oxygen and methane.

3. The process of claim 1 in which the step of monitoring the intensity of the spectrum continuously includes monitoring for the $C_2$ radical and beta hydrogen $H_\beta$ spectral emissions.

4. The process of claim 1 in which the step of monitoring the intensity of the spectrum continuously includes monitoring for the $C_2$ radial and CH.

5. The process of claim 1 in which the step of monitoring the intensity of the spectrum continuously includes monitoring for CH and alfa hydrogen $H_\alpha$.

6. The process of claim 1 in which the step of monitoring the intensity of the spectrum continuously includes monitoring for CH and beta hydrogen $H_\beta$.

7. The process of claim 1 in which said diamond forming constituents include a contaminant.

8. The process of claim 7 in which the contaminant is a cyano group CN.

9. The process of claim 1 further including aborting the process for depositing the diamond on the substrate when the relative emission ratio of a cyano group CN to the background signal is greater than 1.05.

10. The diamond deposition process of claim 1 in which the relative emission intensity ratio is from 1.0:1 to 40.0:1.

11. The diamond deposition process of claim 1 in which monitoring the spectral emissions occurs at the center of the plasma.

12. The diamond deposition process of claim 1 in which the microwave power density is from 0.2 kW/cm$^2$ to 5 kW/cm$^2$ in the substrate deposition area.

13. The diamond deposition process of claim 1 in which the power is provided at up to 3 MW.

14. The diamond deposition process of claim 1 in which the pressure of the generator is between 10 Torr and 1 atmosphere.

15. The diamond deposition process of claim 10 in which the pressure of the generator is between 50 and 200 Torr.

16. The diamond deposition process of claim 1 in which introducing diamond forming constituents includes providing a single compound which include at least two of the constituents.

* * * * *